(12) United States Patent
Kajita

(10) Patent No.: US 7,526,390 B2
(45) Date of Patent: Apr. 28, 2009

(54) SIGNAL MEASURING CIRCUIT AND SIGNAL MEASURING METHOD

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/582,908

(22) Filed: Oct. 18, 2006

(65) Prior Publication Data
US 2007/0094581 A1   Apr. 26, 2007

(30) Foreign Application Priority Data
Oct. 24, 2005   (JP) ............................. 2005-308992

(51) Int. Cl.
*G06F 3/00*   (2006.01)

(52) U.S. Cl. ........................... 702/57; 702/58; 702/182; 702/183

(58) Field of Classification Search ................. 702/45, 702/65, 86, 127, 162, 177, 182, 183, 57, 702/58, 55; 340/347; 341/164, 166; 375/344; 713/500, 503; 714/799; 327/279
See application file for complete search history.

(56) References Cited

U.S. PATENT DOCUMENTS

| | | | | |
|---|---|---|---|---|
| 4,118,698 A | * | 10/1978 | Becker | ........................ 341/120 |
| 4,710,748 A | * | 12/1987 | Champavier | ................. 341/122 |
| 5,909,186 A | * | 6/1999 | Gohringer | .................... 341/120 |
| 6,215,345 B1 | * | 4/2001 | Yashiba et al. | ............... 327/279 |
| 6,559,788 B1 | * | 5/2003 | Murphy | ....................... 341/164 |
| 7,116,114 B2 | * | 10/2006 | Kajita | ......................... 324/613 |

FOREIGN PATENT DOCUMENTS

JP   4-95880   3/1992
JP   4-170224   6/1992

OTHER PUBLICATIONS

Ali Muhtaroglu, etc., Intel Corporation, Logic Technology Development, "On-Die Droop Detector for Analog Sensing of Power Supply Noise", 2003 Symposium on VLSI Circuits Digest of Technical Papers.

* cited by examiner

*Primary Examiner*—Eliseo Ramos Feliciano
*Assistant Examiner*—Felix E Suarez
(74) *Attorney, Agent, or Firm*—Scully, Scott, Murphy & Presser, P.C

(57) ABSTRACT

To provide a signal measuring circuit that measures a signal, such as noise, with high precision. A maximum reference value and a minimum reference value are generated based on the voltage level of a signal, the voltage difference between the maximum reference value and the minimum reference value is divided, a reference value is generated according to the divided voltage, and the voltage level of the signal is compared with the reference value, thereby measuring the signal.

23 Claims, 11 Drawing Sheets

SIGNAL MEASURING CIRCUIT AND SIGNAL MEASURING METHOD

BACKGROUND OF THE INVENTION

The present invention relates to a signal measuring circuit and a signal measuring method used for the measuring circuit, and more particularly to a signal measuring circuit suitable for a measurement of a power supply noise generated by a large scale integrated circuit (LSI) and a signal measuring method used for the signal measuring circuit.

Recently, an operating speed of an LSI has been significantly increased. Accordingly, a power supply voltage or a grounding voltage tends to more easily vary and a high-frequency power supply noise tends to more easily occur in the LSI. This kind of power supply noise causes a failure of operation of a wireless device (degradation in reception quality, for example) or an abnormal operation of other electronic devices. In particular, in computers, the power supply noise caused by radiation of electromagnetic waves according to a cycle of the internal clock is increasing. The increase of power supply noise leads directly to a delay in signal propagation and adversely affects the operation of the LSI. In design for LSIs, it is important to precisely grasp the condition of the power supply noise. However, as described above, the frequency of the power supply noise is becoming higher. Thus, when observing the power supply noise from outside of the LSI, the high frequency component attenuates before reaching a point of observation. Therefore, it is difficult to make a precise measurement. Thus, in order to observe the power supply noise with high precision, it is essential that the power supply noise be observed inside the LSI. A related art of this kind is described in Ali Muhtaroglu, etc., Intel Corporation, Logic Technology Development, "On-Die Droop Detector for Analog Sensing of Power Supply Noise", 2003 Symposium on VLSI Circuits Digest of Technical Papers.

FIGS. 10 and 11 are circuit diagrams showing electrical configurations of parts of a power supply noise measuring circuit described in above mentioned conventional art.

A reference unit shown in FIG. 10 has digital/analog (D/A) converters (DACs) 1 and 2, and a last stage 3 (NI-mirrors, FIG. 4 of Ali Muhtaroglu etc). The DAC 1 is used to calibrate an offset of a reference current caused by the process/voltage/temperature (PVT) condition and a mismatch between a positive reference current Iref+ and a negative reference current Iref−. The DAC 2 is used to program a voltage threshold suitable for detection of a variation in power supply voltage. The last stage 3 has a current mirror circuit for generating the positive and negative reference currents Iref+ and Iref−. The reference unit is designed to provide a measurement resolution of 10 to 20 mv, and the resolution varies depending on the setting of the DC voltage.

A detector module shown in FIG. 11 generates voltage thresholds vref1 and vref2 by use of the reference currents Iref+ and Iref− generated by the reference unit. Generally, in the power supply noise measuring circuit, the detector module receives the reference currents Iref+ and Iref− generated by the reference unit, detector module compares the voltage thresholds vref1 and vref2 with power supply potentials Vcc and Vss, and detector module outputs a result of comparison.

On page 4 and in FIG. 4 of Japanese Patent Laid-Open Hei No. 4-95,880, a related continuous high-frequency noise measuring apparatus is described. In the related continuous high-frequency noise measuring apparatus, first and second trigger controllers receive first and second trigger signals, respectively, after waiting a predetermined period of time. Thus, there is no need of increasing a processing speed of first and second counters and first and second comparators, so that the apparatus can be comprised inexpensively.

On page 3 and in FIG. 1 of Japanese Patent Laid-Open Hei No. 4-170,224, a related A/D converter is described. The related A/D converter generates a plural-bit digital signal register value in one clock cycle, so that the time for conversion of analog signal to digital signal is reduced by half or more.

SUMMARY OF THE INVENTION

The related art described above has problems described below.

Since the resolution of the power supply noise measuring circuit shown in FIGS. 10 and 11 is fixed by the vref1 and vref2, so a resolution of voltage component of the power supply noise can not be set flexibly. Thus, it is difficult to make a measurement a noise wave form precisely. Since are solution of time component of the power supply noise is also fixed at about 1 GHz, the amount of effective data concerning the low-frequency noise is small relative to its total amount. Since the high-frequency noise is also kept track of within the limit of the resolution, it is difficult to keep track of even a 1-GHz noise. Since the noise is measured while generating the vref1 and vref2, there are problems that it takes long to obtain the waveform, and that there is a high possibility that the waveform of a noise that appears only once cannot be kept track of.

The measuring apparatus described in Japanese Patent Laid-Open Hei No. 4-95,880 and the A/D converter described in Japanese Patent Laid-Open Hei No. 4-170,224 have different object and constitution from those of the present invention and cannot solve the problems described above.

The present invention has been devised in view of the circumstances described above, and an object thereof is to provide a noise measuring circuit that measures the level of power supply noise generated in an LSI using an optimum reference value at optimum time intervals according to the waveform of the noise and observes the waveform with high precision.

According to one aspect of the present invention, a signal measuring circuit, is provided which includes: a first circuit which generates a maximum reference value and a minimum reference value by renewing a first reference value and a second reference value according to results of comparisons of said first reference value and said second reference value with a first signal inputted to said signal measuring circuit, respectively; a second circuit which generates a middle reference value between said maximum reference value and said minimum reference value; and a third circuit which compares said middle reference value with a second signal inputted to said signal measuring circuit after generation of said maximum reference value and said minimum reference value.

According to another aspect of the present invention, a method for controlling a signal measuring circuit, is provided which includes: comparing a first reference value and a first signal inputted to said signal measuring circuit; comparing a second reference value and said first signal inputted to said signal measuring circuit; generating a maximum reference value by renewing said first reference value according to a result of comparison between said first reference value and said first signal; generating a minimum reference value by renewing said second reference value according to a result of comparison between said second reference value and said first signal; generating a middle reference value between said maximum reference value and said minimum reference value; and comparing said middle reference value with a second signal inputted to said signal measuring circuit after generation of said maximum reference value and said minimum reference value by use of a comparing circuit.

A method for controlling a signal measuring circuit, is provided which includes: comparing a first reference value with a first signal inputted to said signal measuring circuit to determine whether or not said first reference value is lower than said first signal; generating a maximum reference value by increasing said first reference value each time it is determined that said first reference value is lower than said first signal; comparing a second reference value with said first signal to determine whether or not said second reference value is higher than said first signal; generating a minimum reference value by decreasing said second reference value each time it is determined that said second reference value is higher than said first signal; generating a middle reference value between said maximum reference value and said minimum reference value; and comparing said middle reference value with a second signal inputted to said signal measuring circuit after generation of said maximum reference value and said minimum reference value by use of a comparing circuit.

A method for controlling a signal measuring circuit, is provided which includes: comparing a first reference value with a first signal inputted to said signal measuring circuit to determine whether or not said first reference value is lower than said first signal; increasing a first count value each time it is determined that said first reference value is lower than said first signal; converting an increased first count value to a maximum reference value when an increase of said first count value converges; comparing a second reference value with said first signal to determine whether or not said second reference value is higher than said first signal; decreasing a second count value each time it is determined that said second reference value is higher than said first signal; converting a decreased second count value to said minimum reference value when a decrease of said second count value converges; generating a middle reference value between said maximum reference value and said minimum reference value; comparing said middle reference value with a second signal inputted to said signal measuring circuit after generation of said maximum reference value and said minimum reference value by use of a comparing circuit.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

A first exemplary embodiment of the present invention will be described in detail below.

Figure 1:
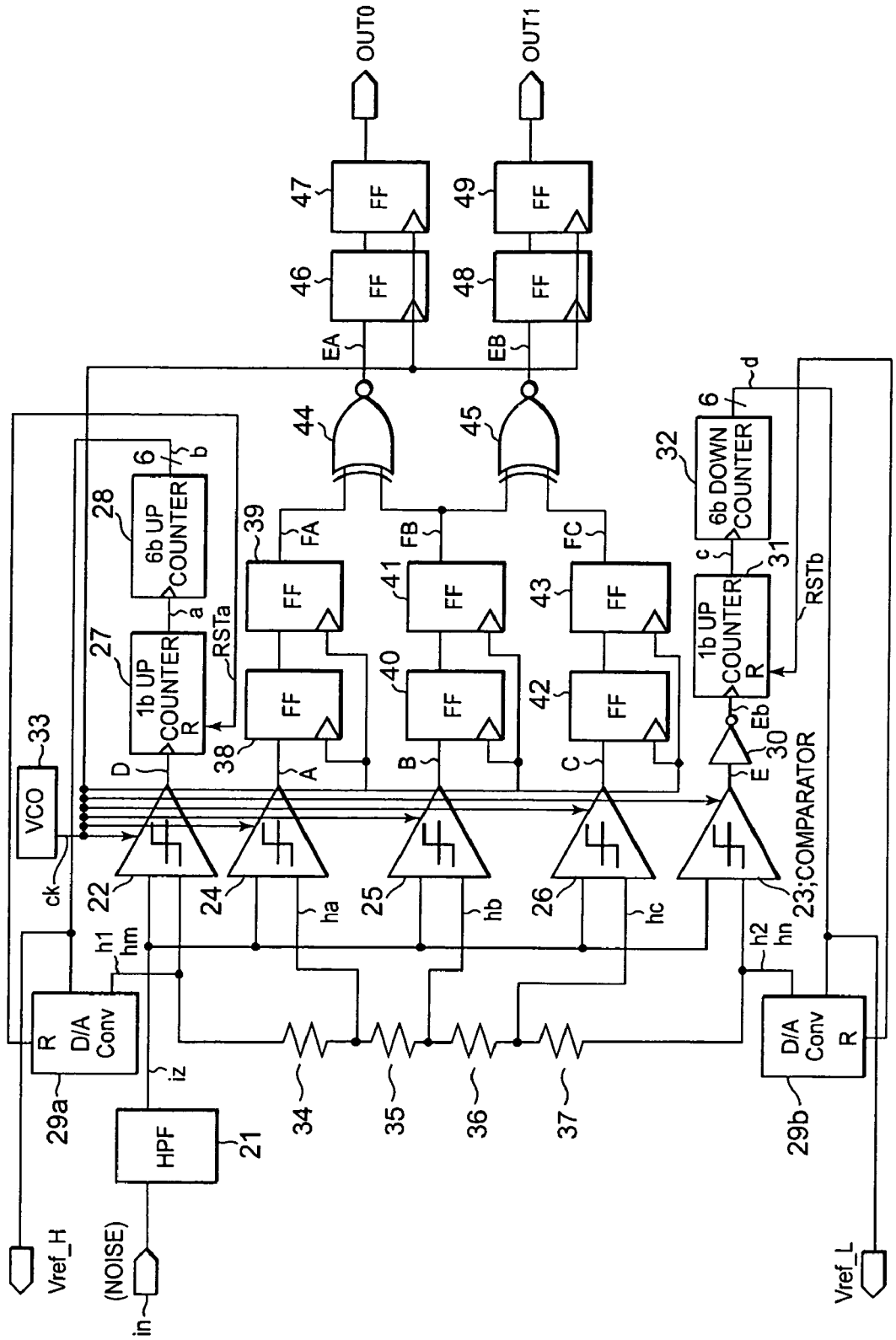
FIG. 1 is a circuit diagram showing an electrical configuration of a measuring circuit according to a first embodiment of the present invention.

FIG. 1 is a circuit diagram showing an electrical configuration of a measuring circuit according to the first embodiment of the present invention.

Referring to FIG. 1, the measuring circuit includes a high pass filter (HPF) 21, comparators 22, 23, 24, 25 and 26, a counter (1*b* up counter) 27, a counter (6*b* up counter) 28, D/A converters (DAC) 29*a* and 29*b*, an inverter 30, a counter (1*b* up counter) 31, a counter (6*b* down counter) 32, a voltage controlled oscillator (VCO) 33, resistors 34, 35, 36 and 37, flip-flops (FF) 38, 39, 40, 41, 42 and 43, exclusive-NOR (ExNOR) circuits 44 and 45, and flip-flops (FF) 46, 47, 48 and 49.

The HPF 21 allows noise "iz" contained in a high frequency region of an incoming signal "in" to pass therethrough. According to this embodiment, the VCO 33 generates a clock signal "ck" fixed at a predetermined frequency (about 3 GHz, for example). The comparator 24 compares a voltage level of the noise "iz" in the incoming signal "in" with a reference value "h1" in synchronization with the clock signal "ck" and generates a result of comparison (described as "A" in FIG. 1). The comparator 25 compares the voltage level of the noise "iz" with a reference value "hb" in synchronization with the clock signal "ck" and generates a result of comparison (described as "B" in FIG. 1). The comparator 26 compares the voltage level of the noise "iz" with a reference value "hc" in synchronization with the clock signal "ck" and generates a result of comparison (described as "C" in FIG. 1). The comparator 22 compares the voltage level of the noise "iz" with a first reference value "h1" in synchronization with the clock signal "ck" and generates a first result of comparison (described as "D" in FIG. 1). The comparator 23 compares the voltage level of the noise "iz" with a second reference value "h2" in synchronization with the clock signal "ck" and generates a second result of comparison (described as "E" in FIG. 1).

The counter 27 is constituted by a 1-bit up counter, for example. The counter 27 counts the first result of comparison "D" from the comparator 22 and generates a count value "a". The counter 28 counts the count value "a" from the counter 27 and generates a count value "b". The count value "b" is also outputted as a high-level reference value "Vref_H". The counters 27 and 28 constitute a first counter. Each time the first result of comparison "D" indicates that the first reference value "h1" is lower than the voltage level of the noise "iz", the first counter counts the first result of comparison "D" and generates a first count value (count value "b"). The DAC 29a resets the counter 27 each time the count value "b" is incremented by 1. The DAC 29a renews the first reference value according to the incremented count value "b". The DAC 29a renews the first reference value repeatedly until an increase of the count value "b" converges. The DAC 29a converts the count value "b" to maximum reference value "hm" when an increase of the count value "b" converges. The comparator 22 compares the voltage level of the noise "iz" in the incoming signal "in" which is inputted to the measuring circuit before the maximum reference value "hm" and the minimum reference value "hn" are set by the DAC 29a and the DAC 29b with the renewed first reference value. Whether or not the count values "b" converges is determined based on whether or not the count value "b" vary in a predetermined time. The DAC 29a determines that the count value "b" converges when the count value "b" does not vary in predetermined time.

The inverter 30 inverts the second result of comparison "E" from the comparator 23, and then outputs an inverted signal "Eb" to the counter 31. The counter 31 is constituted by a 1-bit up counter, for example. The counter 31 receives the inverted signal "Eb", thereby indirectly counting the second result of comparison "E" from the comparator 23, and generates a count value "c". The counter 32 is constituted by a 6-bit down counter, for example, and counts the count value "c" from the counter 31 to generate a count value "d". Besides, the count value "d" is also outputted as a low-level reference value "Vref_L". The counters 31 and 32 constitute a second counter. Each time the second result of comparison "E" indicates that the second reference value "h2" is lower than the voltage level of the noise "iz", the second counter counts the second result of comparison "E" and generates a second count value (count value "d"). When the number of count of the second result of comparison increases, the count value "d" decreases. The DAC 29b resets the counter 31 each time the count value "d" is decremented by 1. The DAC 29b renews the second reference value according to the decremented count value "d". The DAC 29b renews the second reference value repeatedly until a decrease of the count value "d" converges. The DAC 29b converts the count value "d" to minimum reference value "hn" when a decrease of the count value "d" converges. The comparator 23 compares the voltage level of the noise "iz" in the incoming signal "in" which is inputted to the measuring circuit before the maximum reference value "hm" and the minimum reference value "hn" are set by the DAC 29a and the DAC 29b with the renewed second reference value. Whether or not the count values "d" converges is determined based on whether or not the count value "d" vary in a predetermined time. The DAC 29b determines that the count value "d" converges when the count value "d" does not vary in predetermined time.

It is possible for the present invention that the first reference value "h1" and the second reference value "h2" are set to a same value.

The resistors 34, 35, 36 and 37 divide the voltage difference between the maximum reference value "hm" and the minimum reference value "hn". In other words, the voltage difference between the maximum reference value "hm" and the minimum reference value "hn" is divided according to the number of comparators 24, 25 and 26. Then, the reference values "ha", "hb" and "hc" are set, respectively.

The FFs 38 and 39 receive the result of comparison "A" from the comparator 24 in synchronization with the clock signal "ck" and output it as a signal "FA". The FFs 40 and 41 receive the result of comparison "B" from the comparator 25 in synchronization with the clock signal "ck" and output it as a signal "FB". The FFs 42 and 43 receive the result of comparison "C" from the comparator 26 in synchronization with the clock signal "ck" and output it as a signal "FC".

The ExNOR circuit 44 performs ExNOR the signal "FA" and the signal "FB". In other words, whether the signal "FA" and the signal "FB" are coincide or not is determined. The ExNOR circuit 44 outputs an encoded signal "EA" as a result of the decision whether or not the signal "FA" and the signal "FB" are coincide. The ExNOR circuit 45 performs ExNOR the signal "FB" and signal "FC". In other words, whether the signal "FB" and the signal "FC" are coincide or not is determined. The ExNOR circuit 45 outputs an encoded signal "EB" as a result of the decision whether or not the signal "FB" and the signal "FC" are coincide. The FFs 46 and 47 capture the encoded signal "EA" in synchronization with the clock signal "ck" and output it as an encoded signal "OUT0". The FFs 48 and 49 capture the encoded signal "EB" in synchronization with the clock signal "ck" and output it as an encoded signal "OUT1".

Figure 2:
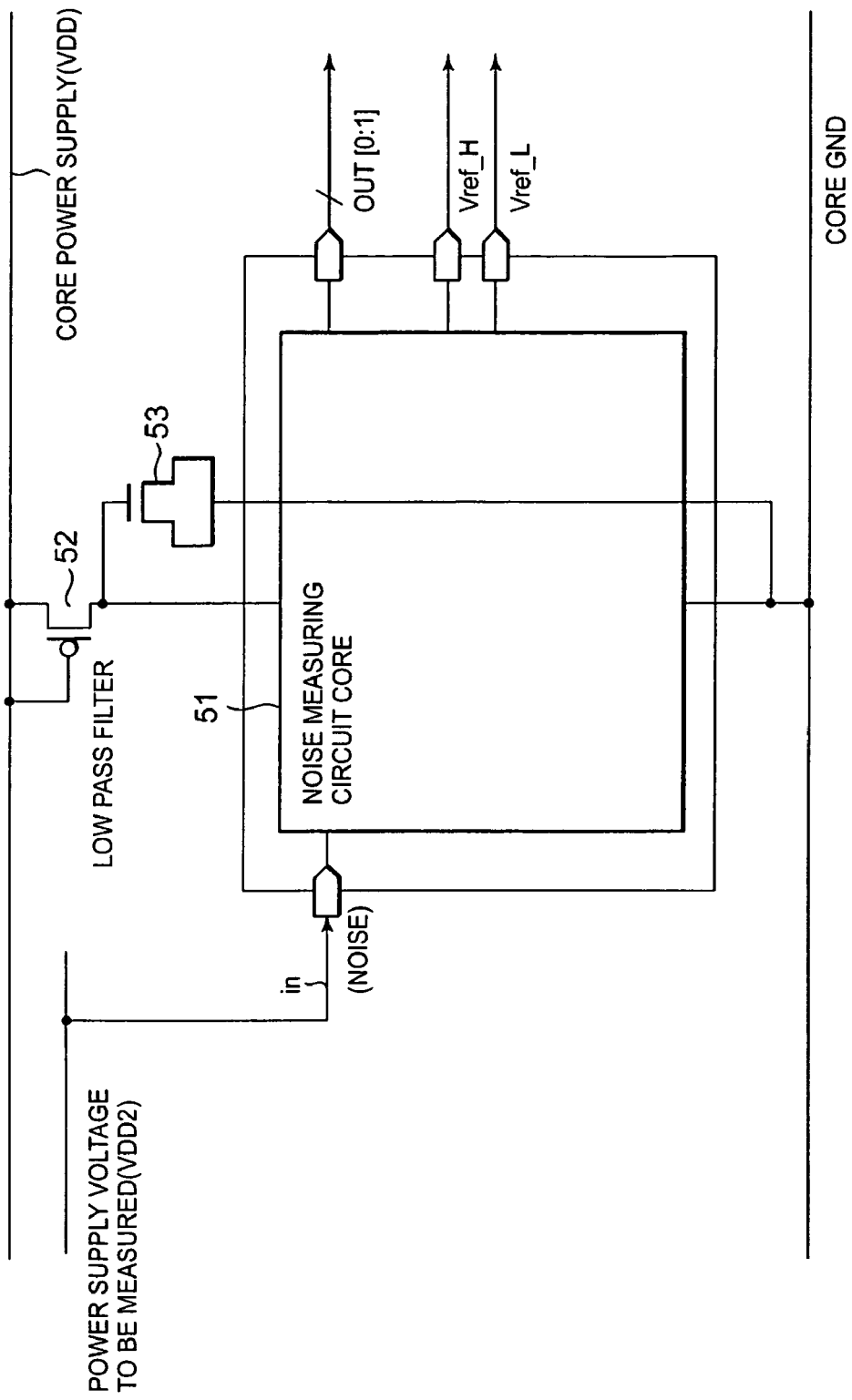
FIG. 2 is a diagram showing a configuration parts of an LSI having the measuring circuit shown in FIG. 1.

FIG. 2 is a diagram showing a configuration of parts of an LSI having the measuring circuit shown in FIG. 1.

As shown in FIG. 2, the LSI has a noise measuring circuit core 51 as the measuring circuit shown in FIG. 1, a p-channel MOSFET (pMOS) 52 and an n-channel MOSFET (nMOS) 53. The noise measuring circuit core 51 receives a power supply voltage (VDD2), which is a target of noise measurement, as the incoming signal "in". The PMOS 52 is equivalent to a resistor, and the nMOS 53 is equivalent to a capacitor. The pMOS 52 and the nMOS 53 constitute a lowpass filter. The low pass filter removes a high frequency region of a core power supply voltage (described as VDD in FIG. 2). The core power supply voltage (VDD) whose high frequency region is provided for the noise measuring circuit core 51.

Figure 3:
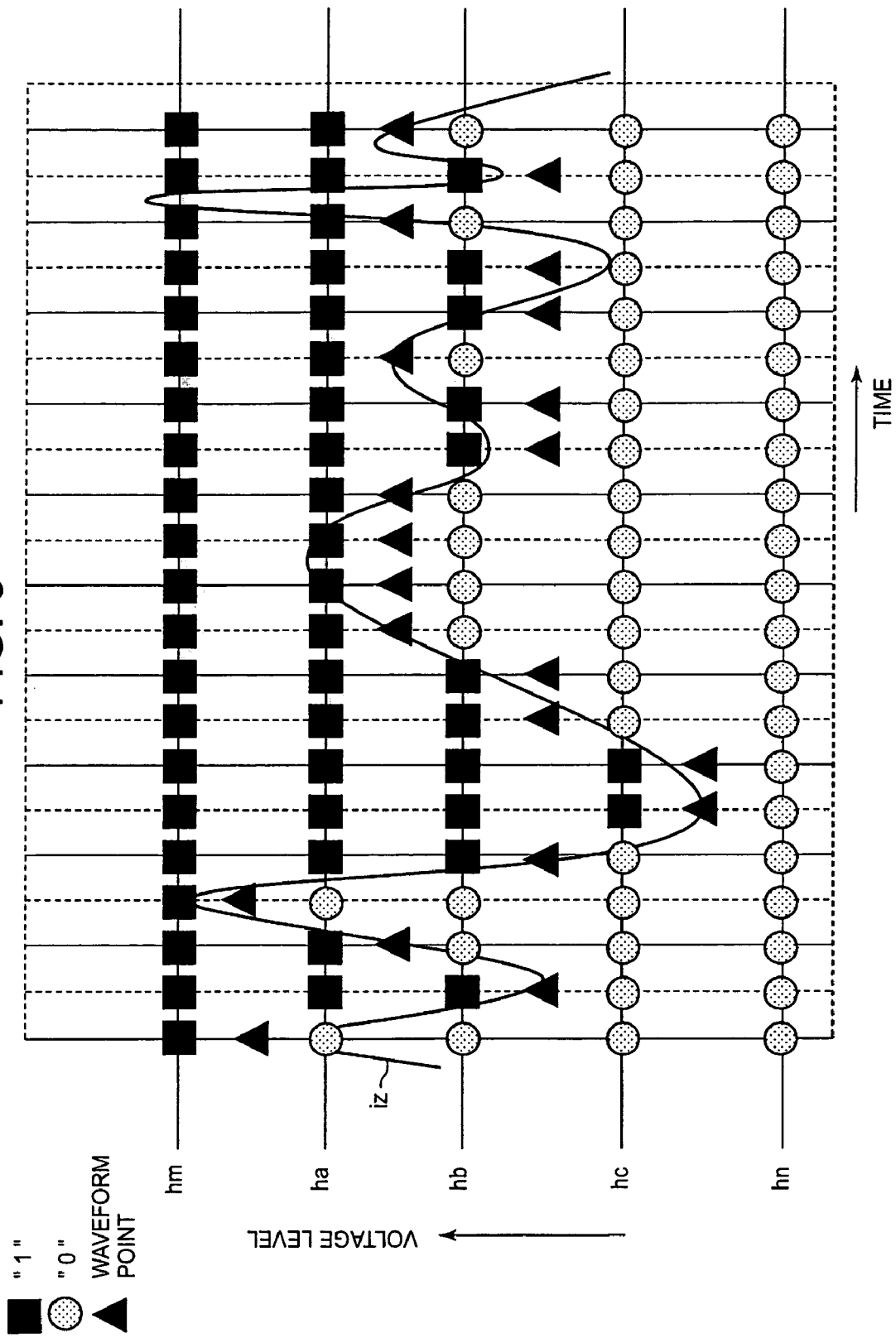
FIG. 3 is a graph showing a result of measurement of power supply noise obtained by the measuring circuit shown in FIG. 1.

FIG. 3 is a graph showing a result of measurement of power supply noise obtained by the measuring circuit shown in FIG. 1. The ordinate indicates voltage level, and the abscissa indicates time.

With reference to this drawing, details of a measuring method used for the measuring circuit according to the first embodiment will be described.

According to this measuring method, the comparator 22 compares the voltage level of the noise "iz" in the incoming signal "in" which is inputted to the measuring circuit before the maximum reference value "hm" and the minimum reference value "hn" are set by the DAC 29a and the DAC 29b with the first reference value "h1" in synchronization with the clock signal "ck", and if the first reference value "h1" is lower than the voltage level of the noise "iz" the DAC29a increases the first reference value "h1", and the DAC29a sets the first reference value "h1" made higher than the voltage level of the noise "iz" as the maximum reference value "hm". In addition, the comparator 23 compares the voltage level of the noise "iz" with the second reference value "h2" in synchronization with the clock signal "ck", and if the second reference value "h2" is higher than the voltage level of the noise "iz", the DAC29b decreases the second reference value "h2", and the DAC29b sets the second reference value "h2" made lower than the voltage level of the noise "iz" as the minimum reference value "hm". Then, the voltage difference between the maximum reference value "hm" and the minimum reference value "hm" is divided by resistors 34, 35, 36 and 37. Then, the reference values "ha", "hb" and "hc" are set, respectively.

The HPF 21 removes the direct current (DC) component in the incoming signal "in". The noise "iz" having a DC voltage that is applied the half of VDD (½VDD) is outputted from HPF 21. The DC voltage is not limited to the half of VDD. At this time, the alternating current (AC) component in the incoming signal "in" is outputted without being processed, so that the high frequency component of the noise is not removed. The noise "iz" is provided for the comparators 22, 23, 24, 25 and 26. The comparator 22 compares the voltage level of the noise "iz" with the first reference value "h1" in synchronization with the clock signal "ck" and generates the first result of comparison "D". The comparator 23 compares the voltage level of the noise "iz" with the second reference value "h2" in synchronization with the clock signal "ck" and generates the second result of comparison "E". In this case, the first reference value "h1" and the second reference value "h2" are set at ½*VDD, for example.

In an initial stage, the first reference value "h1", and the second reference value "h2" is either higher or lower than the voltage level of the noise "iz". Therefore, the first result of comparison "D" from the comparator 22 and the second result of comparison "E" from the comparator 23 is either 0 or 1. When the first result of comparison "D" or the second result of comparison "E" is 1, the count value "a" of the counter 27 or the count value "c" of the counter 31 shift from 0 to 1. Thus, the counter 28 delivers the count value "b" incremented by 1 from the preceding count value to the DAC 29a, and the counter 32 delivers the count value "d" decremented by 1 from the preceding count value to the DAC 29b. The count value "b" is converted by the DAC 29a, and the DAC 29a outputs the first reference value "h1" that is increased according to the count value "b". The count value "d" is converted by the DAC 29b, and the DAC 29b outputs the second reference value "h2" that is decreased according to the count value "d". Then, again, the comparator 22 compares the voltage level of the noise "iz" with the increased first reference value "h1" in synchronization with the clock signal "ck" and generates the first result of comparison "D". Besides, the comparator 23 compares the voltage level of the noise "iz" with the decreased second reference value "h2" in synchronization with the clock signal "ck" and generates the second result of comparison "E". At this time, the DACs 29a and 29b output reset signals RSTa and RSTb to reset the count values "a" and "c" of the counters 27 and 31, respectively.

The operation described above is repeated, thereby making the first reference value "h1" higher than the voltage level of the noise "iz" and the second reference value "h2" lower than the voltage level of the noise "iz". In this state, the count values "a" and "c" of the counters 27 and 31 do not change, so that the count values "b" and "d" of the counters 28 and 32 do not change, and neither increment nor decrement of the counters occurs. In other words, the varying count values "b" and "d" converge. The DAC 29a converts the converged count value "b", and generate the maximum reference value "hm". The DAC 29b converts the converged count value "d" and generate the minimum reference value "hn". The voltage difference between the maximum reference value "hm" and the minimum reference value "hn" is divided by the resistors 34, 35, 36 and 37, and the reference values "ha", "hb" and "hc" are set, respectively. In this case, the reference values "ha", "hb" and "hc" are set at ¾, 2/4 and ¼ of the voltage difference between the maximum reference value "hm" and the minimum reference value "hn", respectively.

The comparator 24 compares the voltage level of the noise "iz" with the reference value "ha" in synchronization with the clock signal "ck" and generates the result of comparison "A". The comparator 25 compares the voltage level of the noise "iz" with the reference value "hb" in synchronization with the clock signal "ck" and generates the result of comparison "B". The comparator 26 compares the voltage level of the noise "iz" with the reference value "hc" in synchronization with the clock signal "ck" and generates the result of comparison "C". The result of comparison "A" is captured by the FFs 38 and 39 in synchronization with the clock signal "ck" and is outputted therefrom as the signal "FA". The result of comparison "B" is captured by the FFs 40 and 41 in synchronization with the clock signal "ck" and is outputted therefrom as the signal "FB". The result of comparison "C" is captured by the FFs 42 and 43 in synchronization with the clock signal "ck" and is outputted therefrom as the signal "FC".

The ExNOR circuit 44 performs ExNOR the signal "FA" and the signal "FB". Then the ExNOR circuit 44 outputs the encoded signal "EA". The ExNOR circuit 45 performs ExNOR the signal "FA" and the signal "FB". Then the ExNOR circuit 45 outputs the encoded signal "EB". The encoded signal "EA" is captured by the FFs 46 and 47 in synchronization with the clock signal "ck" and is outputted therefrom as the encoded signal "OUT0". The encoded signal "EB" is captured by the FFs 48 and 49 in synchronization with the clock signal "ck" and is outputted therefrom as the encoded signal "OUT1".

The results of comparison (A, B, C) of the comparators 24, 25 and 26 can be any of four combinations including (1, 1, 1), (0, 1, 1), (0, 0, 1) and (0, 0, 0). Thus, the encoded signals (OUT0, OUT1) can be any of four combinations including (1, 1), (0, 1), (1, 0) and (1, 1). From the encoded signals (OUT0, OUT1), the waveform of the noise "iz" can be measured. In the cases where the results of comparison (A, B, C) are (1, 1, 1) and (0, 0, 0), the same encode signals (OUT0, OUT1) result. However, when restoring the waveform, there is a clear distinction between (1, 1, 1) and (0, 0, 0), and thus, there is no significant problem. The encoded signals (OUT0, OUT1) are outputted to the outside as digital signals. The encode signals (OUT0, OUT1) are preferably outputted by equal-length wiring.

The result of comparison of the voltage level of the noise "iz" with the reference values "ha", "hb" and "hc" is shown as closed-triangle symbol in FIG. 3, for example. In this case, although some of noises that are faster than the frequency of the clock signal "ck" from the VCO 33 cannot possibly be captured, the specification of the measuring circuit can be determined according to the tradeoff between the precision of the measurement and the space for the hardware component (that is, the speed of the VCO 33 is raised or the number of comparators is increased at the cost of the circuit area). In addition, the encoded signals (OUT0, OUT1) can be observed with an oscilloscope from the outside of the LSI or can be stored as data in a random access memory (RAM). In addition, the finally determined high level reference value "Vref_H" and low level reference value "Vref_L" are outputted to the outside as an information about the voltage component of the noise "iz".

Figure 4:
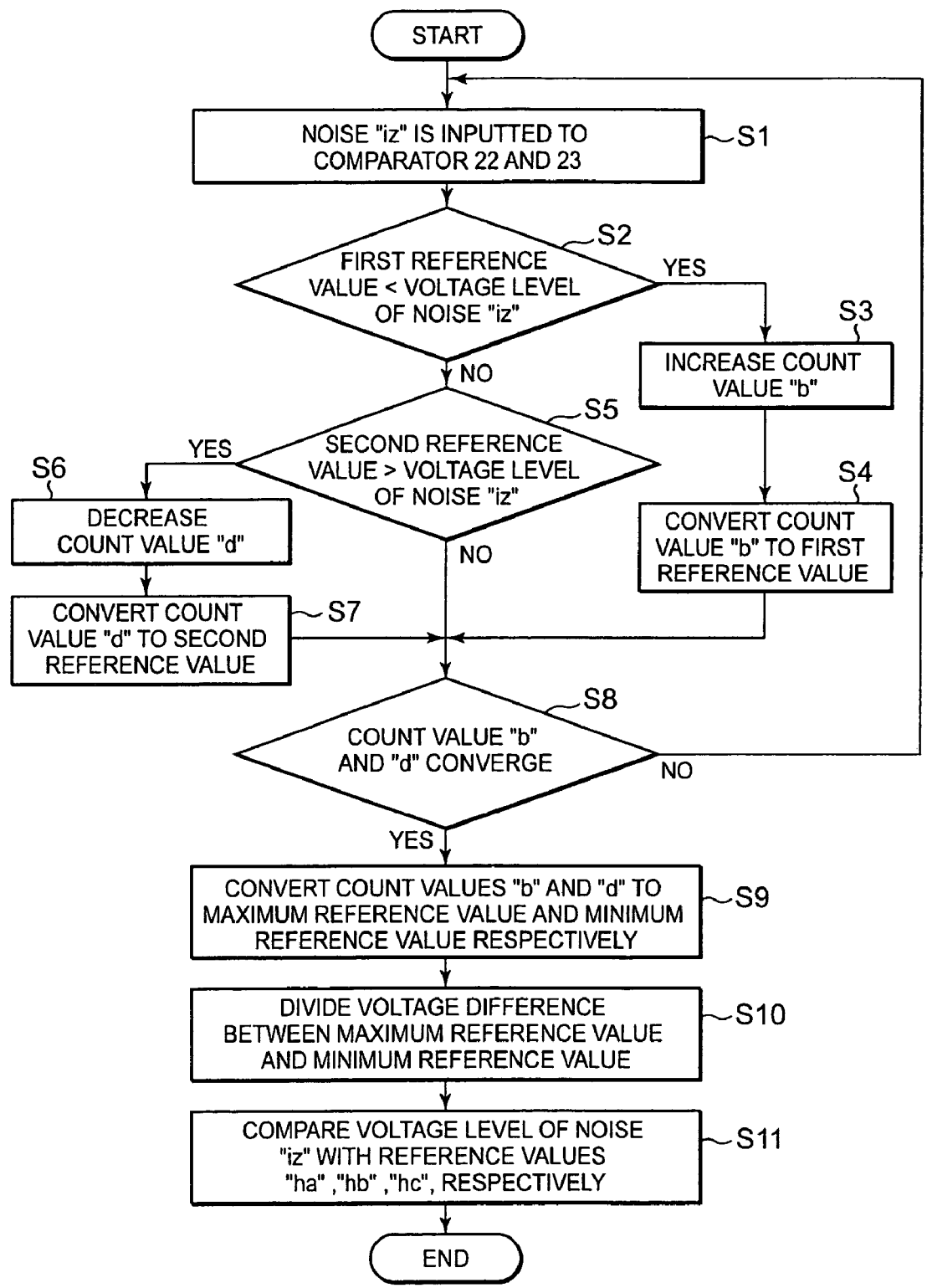
FIG. 4 is a flowchart illustrating an operation according to the first embodiment of the present invention.

Next, with reference to a flow chart of FIG. 4, an operation according to the first embodiment will be described.

The noize "iz" in the incoming signal "in" is inputted to the comparators 22 and 23 (S1). At this time, the incoming signal "in" is input through the HPF 21.

The comparator 22 compares the voltage level of the noize "iz" with the first reference value "h1" in synchronization with the clock signal "ck" to determine whether or not the first reference value "h1" is lower than the voltage level of the noize "iz" (S2).

If the first reference value "h1" is lower than the voltage level of the noize "iz" (if YES in S2), the counter 28 increases the count value "b" (S3).

The DAC 29a converts the count value "b" to the first reference value "h1" (S4). That is, the DAC 29a increases the first reference value "h1" according to the count value "b".

The comparator 23 compares the voltage level of the noize "iz" with the second reference value "h2", in synchronization with the clock signal "ck" to determine whether or not the second reference value "h2", is higher than the voltage level of the noize "iz" (S5).

If the second reference value "h2" is higher than the noize "iz" (if YES in S5), the counter 32 decreases the count value "d" (S6).

The DAC 29b converts the count value "d" to the second reference value "h2" (S7). That is, the DAC 29b decreases the second reference value "h2" according to the count value "dt".

If the varying count values "b" and "d" converge (if YES in S8), the DAC 29a converts the count value "b" to the maximum reference value "hm", and the DAC 29b converts the count value "d" to the minimum reference value "hn" (S9). Whether or not the count values "b" and "d" converge can be determined based on whether or not the count values vary in a predetermined time. The predetermined time is a plurality of clock periods (30 clock cycles, for example), for example.

If the varying count values "b" and "d" do not converge (if NO in S8), the comparators 22 and 23 compares the noize "iz" with the first reference value and the second reference value, respectively, again.

The voltage difference between the maximum reference value "hm" and the minimum reference value "hn" is divided by the resistors 34, 35, 36 and 37, thereby generating the reference values "ha", "hb" and "hc" (S10).

The comparators 24, 25 and 26 compare the voltage level of the noise "iz" with the reference values "ha", "hb" and "hc", respectively, thereby measuring the voltage level of the incoming signal "in" (S11). The voltage level of the noise "iz" is measured to observe the waveform of the noise "iz". The voltage level of the noise "iz" is measured after the generation of the maximum reference value "hm" and the minimum reference value "hn" has finished.

As described above, according to the first embodiment, the maximum reference value "hm" and the minimum reference value "hn" are generated based on the voltage level of the noise "iz", and the voltage difference between the maximum reference value "hm" and the minimum reference value "hn" is divided by the resistors 34, 35, 36 and 37 according to the number of comparators 24, 25 and 26, thereby the reference values "ha", "hb" and "hc" are set, respectively. Therefore, the waveform of the noise "iz" can be observed with high precision with a relatively small number of hardware components. In other words, the frequency component of the noise "iz" can be observed distinctly. Therefore, the effect of the circuit appropriate measures against the noise can be taken. In addition, since the noise measuring circuit core 51 is connected to the core power supply (VDD) via the low pass filter, the noise measuring circuit core 51 can be disposed at an arbitrary place in the LSI, and any desired noise waveform can be observed.

Next, a second exemplary embodiment of the present invention will be described in detail.

Figure 5:
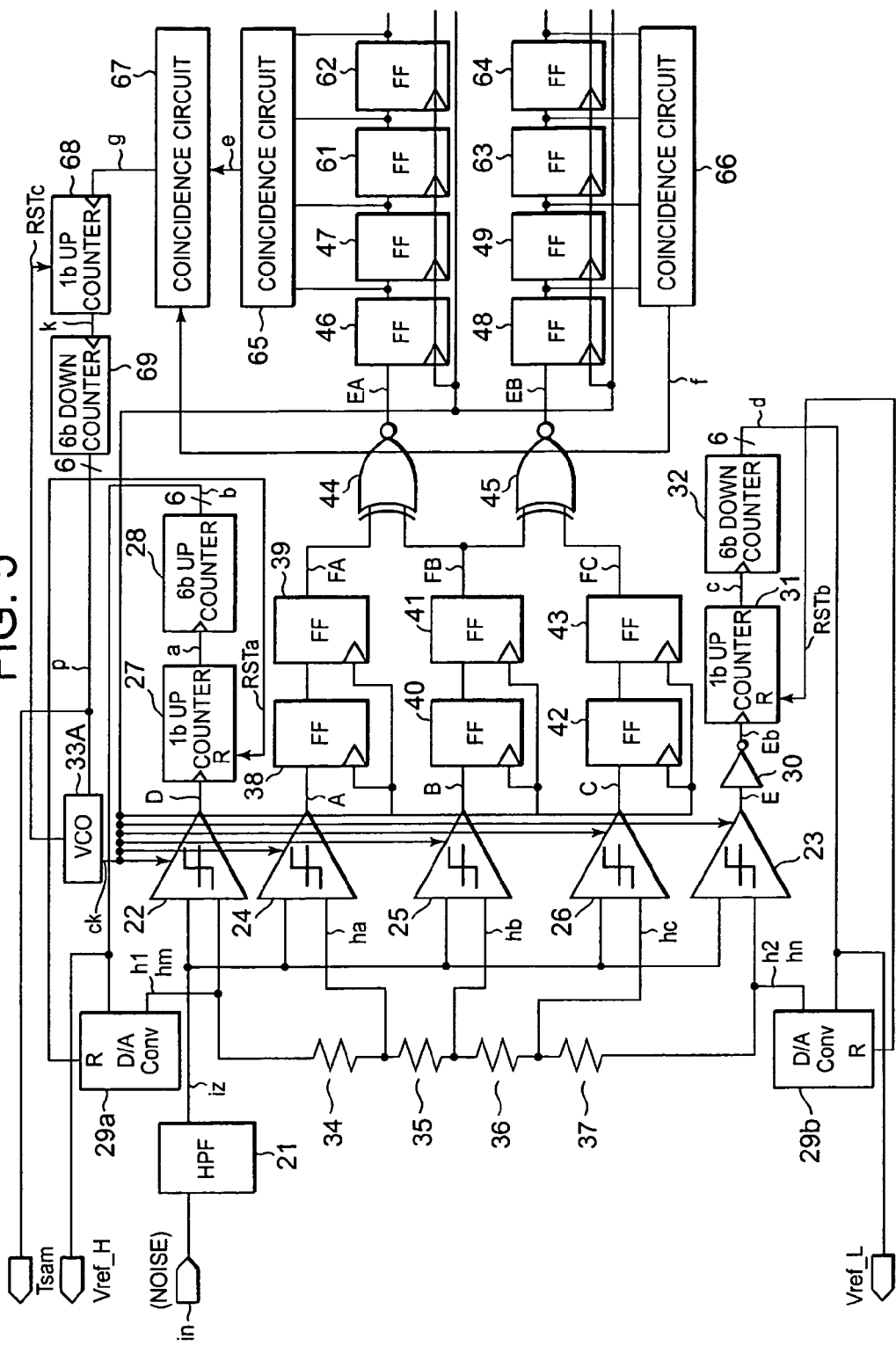
FIG. 5 is a circuit diagram showing an electrical configuration of a measuring circuit according to a second embodiment of the present invention.

FIG. 5 is a circuit diagram showing an electrical configuration of a measuring circuit according to the second embodiment of the present invention. The same elements as those in FIG. 1 showing the first embodiment are denoted by the same reference numerals.

As shown in FIG. 5, the measuring circuit according to the second embodiment has a VCO 33A, which has an additional function, instead of the VCO 33 shown in FIG. 1. In addition, the measuring circuit has FFs 61, 62, 63 and 64, coincidence circuits 65, 66 and 67, a counter (1-bit up counter) 68, and a counter (6-bit down counter) 69. The FFs 61 and 62 are cascaded to the FFs 46 and 47. The FFs 46, 47, 61 and 62 successively capture encoded signals "EA" from the ExNOR circuit 44 in synchronization with the clock signal "ck" and retain encoded signals "EA" for the duration of predetermined clock cycles (four clock cycles, for example). Here, the counter 68 is not necessarily a 1-bit counter, and the counter 69 is not necessarily a 6-bit counter.

The FFs 63 and 64 are cascaded to the FFs 48 and 49. The FFs 48, 49, 63 and 64 successively capture encoded signals "EB" from the ExNOR circuit 45 in synchronization with the clock signal "ck" and retain encoded signals "EB" for the duration of predetermined clock cycles (four clock cycles, for example). The coincidence circuit 65 determines whether the encoded signals "EA" retained in the FFs 46, 47, 61 and 62 coincide with each other or not and outputs a signal "e" as a result of the determination. The coincidence circuit 66 determines whether the encoded signals "EB" retained in the FFs 48, 49, 63 and 64 coincide with each other or not and outputs a signal "f" as a result of the determination. The coincidence circuit 67 determines whether the signal "e" from the coincidence circuit 65 and the signal "f" from the coincidence circuit 66 coincide with each other or not and outputs a signal "g" as a result of the determination.

The counter 68 is constituted by a 1-bit up counter, for example. Each time the signal "g" from the coincidence circuit 67 indicates that the signal "e" and the signal "f" coincide with each other, the counter 68 counts the signal "g" and generates a count value "k". The counter 68 continue counting the signal "g" until the signal "g" indicates that the signal "e" and the signal "f" do not coincide with each other. The down counter 69 is constituted by a 6-bit down counter, for example. The down counter 69 counts the count value "k" from the counter 68 and generates a count value "p". The count value "p" is decreased each time the count value "k" is counted. The count value "p" is also output as clock frequency information "Tsam" corresponding to the frequency of the clock signal "ck" at which a change in waveform of the noise "iz" is detected. The VCO 33A generates the clock signal "ck" having a frequency corresponding to the count value "p" and resets the counter 68. The remainder of the configuration of the measuring circuit shown in FIG. 5 is the same as that shown in FIG. 1.

Figure 6:
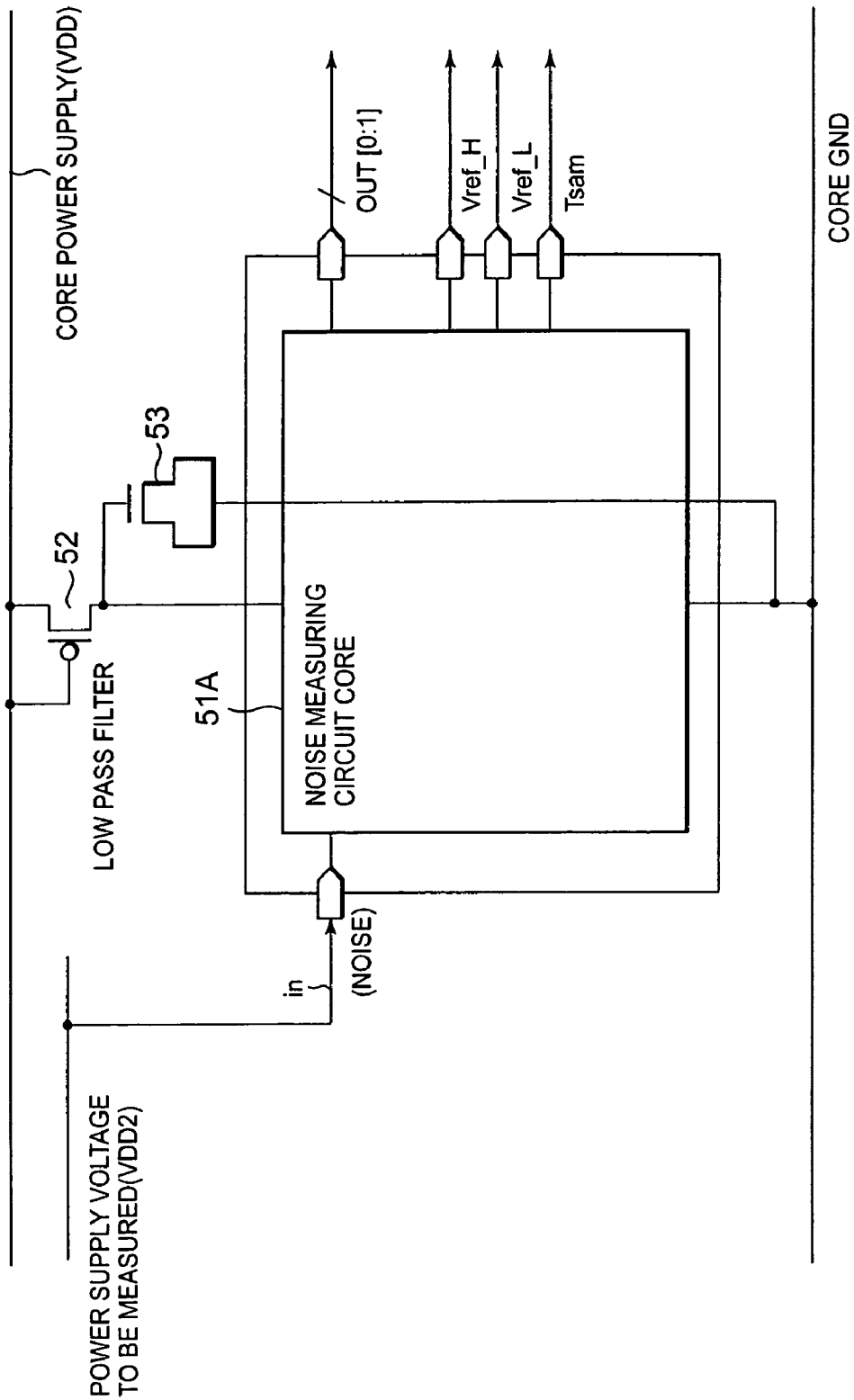
FIG. 6 is a diagram showing a configuration of parts of an LSI having the measuring circuit shown in FIG. 5.

FIG. 6 is a diagram showing a configuration of parts of an LSI having the measuring circuit shown in FIG. 5. The same elements as those in FIG. 2 showing the first embodiment are denoted by the same reference numerals.

As shown in FIG. 6, instead of the noise measuring circuit core 51 shown in FIG. 2, the LSI has a noise measuring circuit core 51A having a configuration different from that of the noise measuring circuit core 51. The noise measuring circuit core 51A has a function of outputting the clock frequency information "Tsam" in addition to the functions of the noise measuring circuit core 51.

In the measuring circuit, whether or not a change occurs in waveform of the noise "iz" is determined for the duration of predetermined clock cycles, and the frequency of the clock signal "ck" generated by the VCO 33A is set as the frequency at which detection of a change in waveform of the noise "iz" occurs. In this case, it is determined whether or not the waveform of the noise "iz" changes for the duration of predetermined clock cycles, and the frequency of the clock signal "ck" generated by the VCO 33A is set as the frequency at which detection of noncoincidence of the waveforms of the noises "iz".

That is, if the signal "g", from the coincidence circuit 67 indicates that the signal "e" and the signal "f" coincide with each other, no change occurs in waveform of the noise "iz". If no change occurs in waveform, the count value "k" of the counter 68 changes from the initial value 0 to 1, and thus, the count value "p" of the counter 69 is decreased. The VCO 33A decreases the frequency of the clock signal "ck", which is set at a maximum value at the start of operation, according to the count value "p". At this time, the VCO 33A outputs a reset signal RSTc to reset the count value "k" of the counter 68 to 0. By repeating this operation, the waveform of the noise "iz" is observed in appropriate cycle. The count value "p" corresponding to the finally set frequency of the clock signal "ck" is outputted as the clock frequency information "Tsam".

In the case where the encoded signals (OUT0, OUT1) are extracted from the outputs of the FFs 47 and 49 and stored in a RAM, the resource of the RAM is used without any loss, and efficient waveform observation is achieved. Even if the encoded signals (OUT0, OUT1) are not stored in the RAM but observed with an oscilloscope, as much waveform information as possible can be stored in a memory of the oscilloscope by adjusting the time resolution of the oscilloscope based on the clock frequency information "Tsam".

Figure 7:
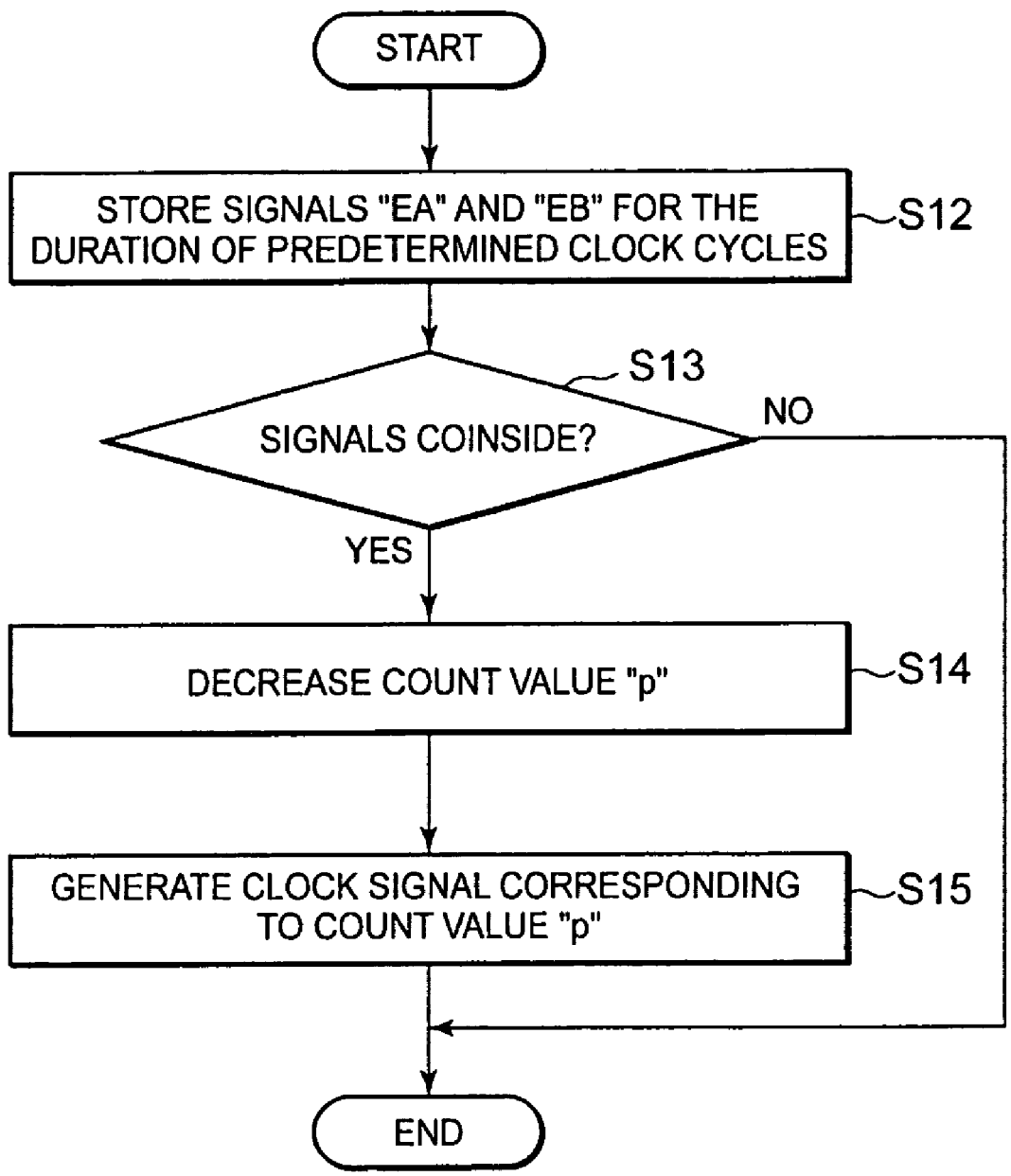
FIG. 7 is a flowchart illustrating an operation according to the second embodiment of the present invention.

Next, with reference to a flow chart of FIG. 7, an operation according to the second embodiment will be described.

The, FFs 46, 47, 61 and 62 and the FFs 48, 49, 63 and 64 store the signals "EA" and "EB" for the duration of the predetermined clock cycles measured by the comparators 24, 25 and 26 (S12). For example, the FFs store the signals for four clock cycles.

The coincidence circuits 65, 66 and 67 compare the signals stored in the FFs 46, 47, 61 and 62 and the FFs 48, 49, 63 and 64 with each other to determine whether the signals stored in the FFs 46, 47, 61 and 62 and the FFs 48, 49, 63 and 64 coincide with each other (S13).

If the signals coincide with each other (if YES in S13), the counter 69 decreases the count value "p" (S14).

The VCO 33A generates the clock signal corresponding to the count value "p" (S15). That is, the VCO 33A generates the clock signal having a frequency decreased based on the count value "p".

As described above, according to the second embodiment, it is determined whether or not the waveform of the noise "iz" changes for the duration of predetermined clock cycles, and the frequency of the clock signal "ck" generated by the VCO 33A is set as the frequency at which detection of noncoincidence of the waveforms of the noises "iz". Thus, in addition to the advantages of the first embodiment, efficient waveform observation is realized.

Next, a third exemplary embodiment of the present invention will be described in detail.

Figure 8:
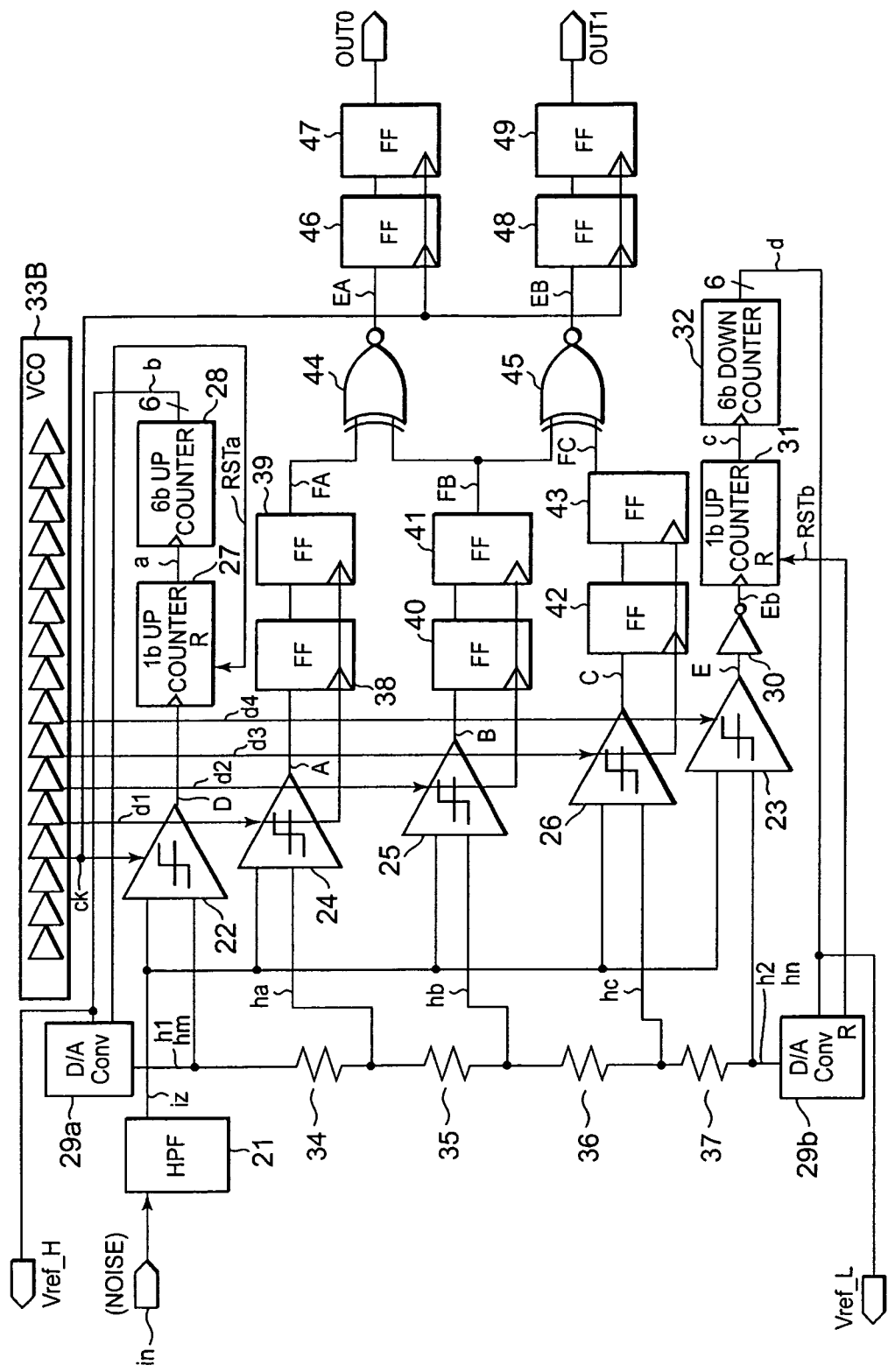
FIG. 8 is a circuit diagram showing an electrical configuration of a measuring circuit according to a third embodiment of the present invention.

FIG. 8 is a circuit diagram showing an electrical configuration of a measuring circuit according to a third embodiment of the present invention.

Referring to FIG. 8, instead of the VCO 33 shown in FIG. 1, a VCO 33B having a different configuration is provided. The VCO 33B has a delay circuit that outputs the delayed clock signal and the VCO 33B outputs clock signals "d1", "d2", "d3" and "d4", which are delayed by ¼, ½ and ¾ of a clock cycle and 1 clock cycle, respectively, for example. The clock signal "ck" is supplied to the comparator 22, the clock signal "d1" is supplied to the comparator 24, the clock signal "d2", is supplied to the comparator 25, the clock signal "d3" is supplied to the comparator 26, and the clock signal "d4" is supplied to the comparator 23. The remainder of the configuration of the measuring circuit is the same as that shown in FIG. 1.

Figure 9:
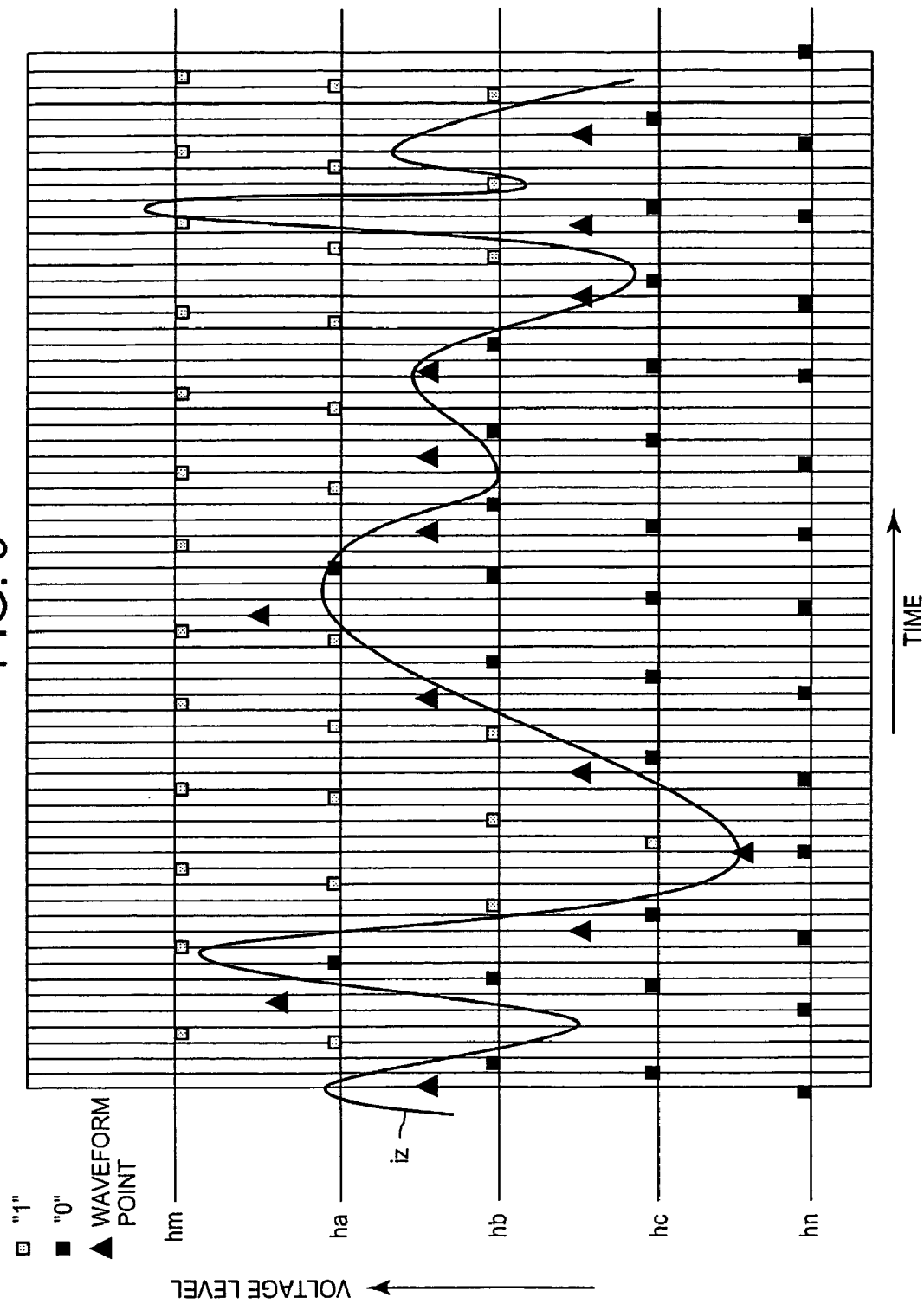
FIG. 9 is a graph showing a result of measurement of power supply noise obtained by the measuring circuit shown in FIG. 8.
Figure 10:
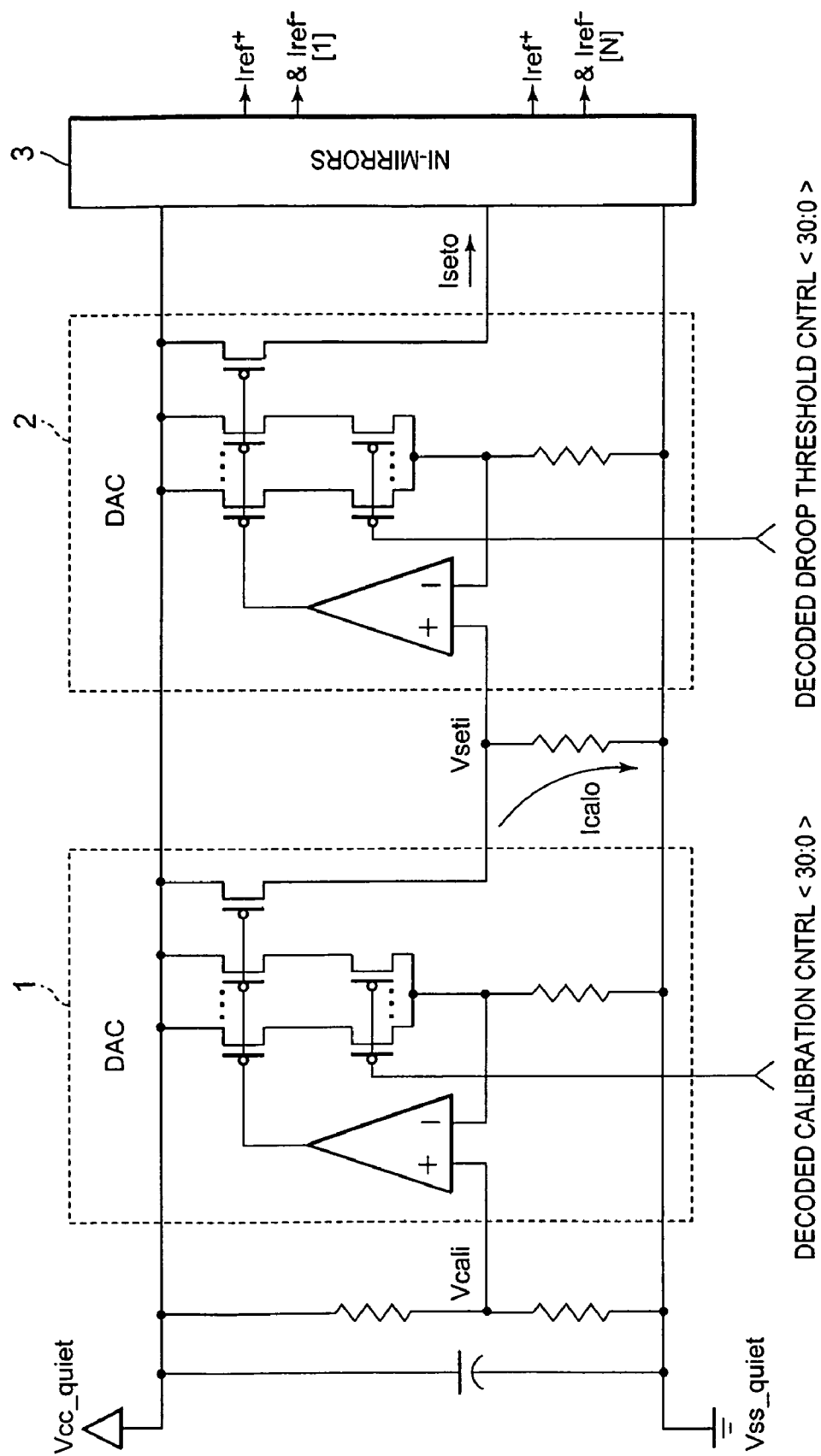
FIG. 10 is a circuit diagram showing an electrical configuration of a part of a measuring circuit described in Ali Muhtaroglu, etc., Intel Corporation, Logic Technology Development, "On-Die Droop Detector for Analog Sensing of Power Supply Noise", 2003 Symposium on VLSI Circuits Digest of Technical Papers.
Figure 11:
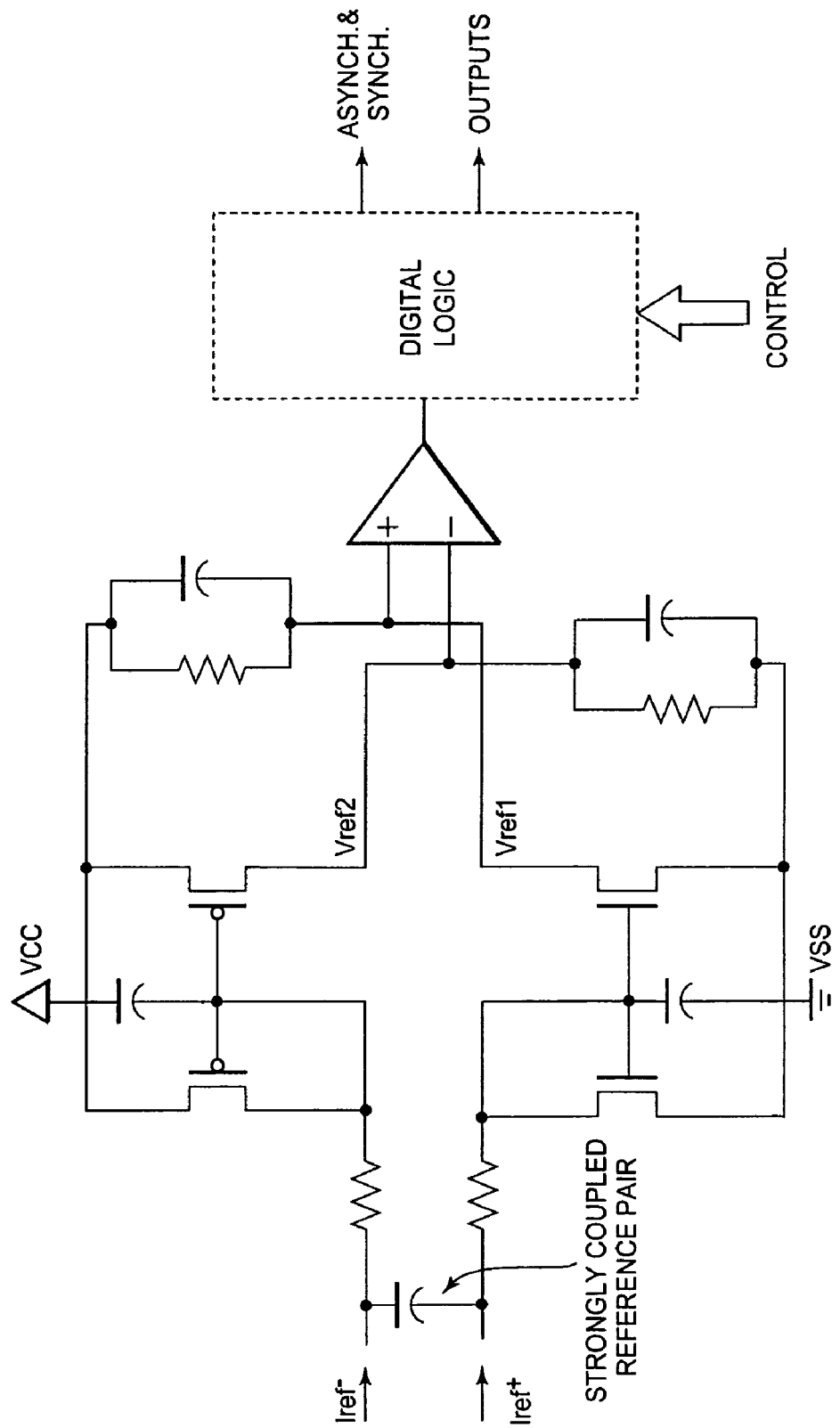
FIG. 11 is a circuit diagram showing an electrical configuration of another part of the measuring circuit described in Ali Muhtaroglu, etc., Intel Corporation, Logic Technology Development, "On-Die Droop Detector for Analog Sensing of Power Supply Noise", 2003 Symposium on VLSI Circuits Digest of Technical Papers.

FIG. 9 is a graph showing a measurement result obtained by the measuring circuit shown in FIG. 8. The ordinate indicates voltage level, and the abscissa indicates time.

With reference to this drawing, details of a power supply noise measuring method used for the measuring circuit according to this embodiment will be described.

According to this measuring method, the clock signals "d1", "d2" and "d3" that are out of phase with each other are supplied to the comparators 24, 25 and 26, respectively, and the clock signals "ck" and the "d4", having the same phase are supplied to the comparators 22 and 23, respectively. Thus, as shown in FIG. 9, the time resolution for detection of the noise "iz" is increased. Therefore, in addition to the advantages of the first embodiment, peaks of the noise "iz" can be detected with higher probability, and the waveform of the noise "iz" can be observed with higher precision.

Although embodiments of the present invention have been described in detail with reference to the drawings, the present invention is not limited to the specific configurations according to the embodiments, and any modifications in design are included in the present invention without departing from the spirit of the present invention.

For example, the number of the comparators 24, 25 and 26 serving as noise detecting comparator circuits is not limited to the number described with regard to the embodiments described above and can be increased or decreased depending on the application, and the number of resistors 34, 35, 36 and 37 may be increased or decreased depending on the number of comparators. In addition, the arrangement following the comparators 24, 25 and 26 is not limited to those in the embodiments described above. In addition, although the clock signal "ck" shown in FIG. 8 is supplied to the comparator 22, and the clock signal "d4" is supplied to the comparator 23 in the third embodiment, connections may be modified so that the clock signal "ck" is supplied to the comparators 22 and 23. In addition, although the power supply noise in the LSI is measured in the embodiments described above, the application of the present invention is not limited to the power supply noise, but the present invention can be applied to measurement of other kinds of noise whose peak level is unknown with substantially the same effects and advantages as in the embodiments described above.

While this invention has been described in conjunction with the preferred embodiments described above, it will now be possible for those skilled in the art to put this invention into practice in various other manners.

What is claimed is:

1. A signal measuring circuit, comprising:
   a first circuit which generates a maximum reference value and a minimum reference value by renewing a first reference value until said first reference value becomes higher than an input signal input to said signal measuring circuit according to a result of comparison of said first reference value with said input signal and by renewing a second reference value until said second reference value becomes lower than said input signal according to results of comparisons of said second reference value with said input signal;
   a second circuit which generates a middle reference value between said maximum reference value and said minimum reference value; and
   a third circuit which compares said middle reference value with said input signal after generation of said maximum reference value and said minimum reference value.

2. The signal measuring circuit according to claim 1, wherein said first circuit generates said maximum reference value by increasing said first reference value according to said result of comparison of said first reference value with a voltage level of said input signal;

wherein said first circuit generates said minimum reference value by decreasing said second reference value according to said result of comparison of said second reference value with said voltage level of said input signal.

3. The signal measuring circuit according to claim 1, wherein said third circuit compares said middle reference value with a voltage level of said input signal.

4. The signal measuring circuit according to claim 1, wherein said first reference value and said second reference value have a same value.

5. The signal measuring circuit according to claim 1, wherein said first circuit comprises:

a first comparator which compares a first reference value with said input signal to determine whether or not said first reference value is lower than said input signal;

a maximum reference value setting circuit which generates said maximum reference value by increasing said first reference value each time said first comparator determines that said first reference value is lower than said input signal;

a second comparator which compares a second reference value with said input signal to determine whether or not said second reference value is higher than said input signal; and a minimum reference value setting circuit which generates said minimum reference value by decreasing said second reference value each time said second comparator determines that said second reference value is higher than said input signal.

6. The signal measuring circuit according to claim 1, wherein said first circuit comprises:

a first comparator which compares a first reference value with said input signal to determine whether or not said first reference value is lower than said input signal;

a first counter which increases a first count value each time said first comparator determines that said first reference value is lower than said input signal;

a first converter which converts an increased first count value to said maximum reference value when an increase of said first count value converges;

a second comparator which compares a second reference value with said input signal to determine whether or not said second reference value is higher than said input signal;

a second counter which decreases a second count value each time said second comparator determines that said second reference value is higher than said input signal; and a second converter which converts a decreased second count value to said minimum reference value when a decrease of said second count value converges.

7. The signal measuring circuit according to claim 6, wherein said first converter determines that said increase of said first count value is converged when said increase of said first count value is not detected in predetermined time, and said second converter determines that said decrease of said second count value is converged when said decrease of said second count value is not detected in predetermined time.

8. The signal measuring circuit according to claim 1, further comprising:

a clock circuit which provides a clock signal for said third circuit; and a frequency setting circuit which observes a result of comparison of said middle reference and said input signal over a plurality of cycles of said clock signal and decreases a frequency of said clock signal if said result of comparison does not vary.

9. The signal measuring circuit according to claim 1, further comprising:

a clock circuit which provides a clock signal for said third circuit;

a plurality of storage elements each of which stores a result of comparison of said middle reference value and said input signal for one cycle of said clock signal;

a detector circuit which detects whether or not said result of comparison stored in said storage elements coincide with each other; and a counter which decreases a count value when said detector circuit determines that said result of comparison coincide with each other, wherein said clock circuit converts said count value to a frequency.

10. The signal measuring circuit according to claim 1, further comprising:

a clock circuit which provides a clock signal for said third circuit; and a plurality of said third circuit;

wherein said clock circuit provides said clock signal for each of said third circuit with a different phase.

11. The signal measuring circuit according to claim 1, further comprising:

a clock circuit which provides a clock signal for said third circuit; and a plurality of said third circuit;

wherein said clock circuit provides said clock signal for each of said third circuit with a predetermined phase difference.

12. The signal measuring circuit according to claim 1, further comprising:

a clock circuit which provides a clock signal for said third circuit;

a plurality of said third circuits; and a plurality of delay circuits each of which delays an incoming clock signal with a predetermined phase difference and provides a delayed clock signal for a corresponding one of said third circuits;

wherein each of said delay circuits is connected to a corresponding one of said third circuits, said delay circuits are connected in series to each other, and each of said delay circuits provides said delayed clock signal having said predetermined phase difference for a following delay circuit connected in series thereto.

13. The signal measuring circuit according to claim 1, further comprising:

a clock circuit which provides a clock signal for said third circuit;

a plurality of said third circuits; and a plurality of delay circuits each of which delays an incoming clock signal with a predetermined phase difference and provides a delayed clock signal for a corresponding one of said third circuits;

wherein said delay circuits are connected in series to each other, each of said delay circuits provides said delayed clock signal having said predetermined phase difference for the following delay circuit connected in series thereto, and said delay circuits are connected to a respective third circuits in such a manner that an amount of delay in said clock signal is smaller for third circuit that uses greater middle reference value.

14. The signal measuring circuit according to claim 1, further comprising:
a clock circuit which provides a clock signal for said third circuit;
a plurality of said third circuits; and
a plurality of delay circuits each of which delays an incoming clock signal with a predetermined phase difference and provides a delayed clock signal for a corresponding one of said third circuits,
wherein said delay circuits are connected in series to each other, each of said delay circuits provides said delayed clock signal having said predetermined phase difference for the following delay circuit connected in series thereto, and said delay circuits are connected to a respective third circuits in such a manner that an amount of delay in said clock signal is smaller for third circuit that uses smaller middle reference values.

15. A method for controlling a signal measuring circuit, comprising:
comparing a first reference value and an input signal inputted to said signal measuring circuit;
comparing a second reference value and said input signal inputted to said signal measuring circuit;
generating a maximum reference value by renewing said first reference value until said first reference value becomes higher than said input signal according to a result of comparison between said first reference value and said input signal;
generating a minimum reference value by renewing said second reference value until said second reference value becomes lower than said input signal according to a result of comparison between said second reference value and said input signal;
generating a middle reference value between said maximum reference value and said minimum reference value; and
comparing said middle reference value with said input signal after generation of said maximum reference value and said minimum reference value by use of a comparing circuit.

16. A method for controlling a signal measuring circuit, comprising:
comparing a first reference value with an input signal inputted to said signal measuring circuit to determine whether or not said first reference value is lower than said input signal;
generating a maximum reference value by increasing said first reference value each time it is determined that said first reference value is lower than said input signal, and by setting said first reference value as said maximum reference value when said first reference value becomes higher than said input signal;
comparing a second reference value with said input signal to determine whether or not said second reference value is higher than said input signal;
generating a minimum reference value by decreasing said second reference value each time it is determined that said second reference value is higher than said input signal, and by setting said second references value as said minimum reference value when said second reference value becomes lower than said input signal;
generating a middle reference value between said maximum reference value and said minimum reference value; and
comparing said middle reference value with said input signal after generation of said maximum reference value and said minimum reference value by use of a comparing circuit.

17. A method for controlling a signal measuring circuit, comprising:
comparing a first reference value with an input signal inputted to said signal measuring circuit to determine whether or not said first reference value is lower than said input signal;
increasing a first count value each time it is determined that said first reference value is lower than said input signal, said first count value is increased until said first reference value becomes higher than said input signal;
converting an increased first count value to a maximum reference value when an increase of said first count value converges;
comparing a second reference value with said input signal to determine whether or not said second reference value is higher than said input signal;
decreasing a second count value each time it is determined that said second reference value is higher than said input signal, said second count value is decreased until said second reference value becomes lower than said input signal;
converting a decreased second count value to said minimum reference value when a decrease of said second count value converges;
generating a middle reference value between said maximum reference value and said minimum reference value;
comparing said middle reference value with said input signal after generation of said maximum reference value and said minimum reference value by use of a comparing circuit.

18. The method according to claim 15, further comprising:
observing a result of comparison between said middle reference value and said input signal over a plurality of cycles of a clock signal; and
decreasing a frequency of said clock signal if said result of comparison does not vary.

19. The method according to claim 15, further comprising:
storing a result of comparison between said middle reference value and said input signal for one cycle of a clock signal in a corresponding one of a plurality of storage elements;
detecting that said result of comparison stored in said storage elements coincide with each other;
decreasing a count value when a coincidence of said result of comparison is detected; and
converting said count value to the frequency of said clock signal.

20. The method according to claim 15, further comprising:
providing a clock signal to each of said comparing circuit with a different phase.

21. The method according to claim 15, further comprising:
providing a clock signal to each of said comparing circuit with a predetermined phase difference.

22. The method according to claim 15, further comprising:
generating a plurality of delayed clock signals having a predetermined phase difference each other;
providing each of said delayed clock signals to a corresponding one of comparing circuits;
wherein said comparing circuits are provided said delayed clock signals in such a manner that an amount of delay in said delayed clock signals is smaller for one of said comparing circuits that uses greater middle reference value.

23. The method according to claim 15, further comprising:
generating a plurality of delayed clock signals having a predetermined phase difference each other;
providing each of said delayed clock signals to a corresponding one of comparing circuits;
wherein said comparing circuits are provided said delayed clock signals in such a manner that an amount of delay in said delayed clock signals is smaller for one of said comparing circuits that uses smaller middle reference value.

* * * * *